United States Patent [19]

Ferrieu

[11] 3,968,354
[45] July 6, 1976

[54] TRANSVERSAL DIGITAL FILTER FOR DELTA CODED SIGNALS

[75] Inventor: Gilbert Marie Marcel Ferrieu, Bievres, France

[73] Assignee: T.R.T. Telecommunications Radioelectriques, Paris, France

[22] Filed: July 17, 1974

[21] Appl. No.: 489,144

[30] Foreign Application Priority Data
July 20, 1973 France .............................. 73.26734

[52] U.S. Cl. .................................. 235/152; 325/42
[51] Int. Cl.² ........................................ G06F 15/34
[58] Field of Search .............. 235/152, 156; 325/42, 325/323; 328/167

[56] References Cited
UNITED STATES PATENTS

| | | |
|---|---|---|
| 3,543,012 | 11/1970 | Courtney ........................ 235/152 X |
| 3,560,659 | 2/1971 | Greefkes et al. ................... 325/42 X |
| 3,753,115 | 8/1973 | Van Gerwen et al. .............. 325/323 |
| 3,777,130 | 12/1973 | Croisier et al. ...................... 235/152 |
| 3,814,917 | 6/1974 | Nussbaumer ........................ 235/152 |
| 3,822,404 | 7/1974 | Croisier et al. ................... 235/152 X |

*Primary Examiner*—David H. Malzahn
*Attorney, Agent, or Firm*—Frank R. Trifari; Daniel R. McGlynn

[57] ABSTRACT

A transversal digital filter including a shift register provided with a number of stages to which level control devices are connected by means of taps, the level control devices being connected to a feedback circuit which is connected through a combination device to the input of the shift register, a delta modulator being incorporated between the combination device and the input of the shift register, and a feedback circuit associated with the delta modulator forming part of the filter.

8 Claims, 7 Drawing Figures

TRANSVERSAL DIGITAL FILTER FOR DELTA CODED SIGNALS

The invention relates to a digital filter for processing an analog signal, comprising a shift register provided with a number of stages to which level control devices are connected by means of taps, said level control devices being connected to a feedback circuit which is connected through a combination device to the input of the shift register, a delta modulator being incorporated between the combination device and the input of the shift register, a feedback circuit associated with the delta modulator forming part of the filter, the delta modulator and said shift register being controlled by a common clock pulse generator, the shift register being furthermore connected to an output circuit which, likewise as the feedback circuit of the filter, is provided with a demodulator.

Digital filters are quite known and were already described in 1940 by H. E. Kallman in an article entitled "Transversal Filters" published in the July 1940 Volume of the Proceedings IRE.

It is known that one of the difficulties of manufacturing these digital filters is the very delicate adjustment of the analogue delay lines. It is obvious that it is much easier to realize a delay of the signals coded with pulses or no pulses by using a shift register with connections but this necessitates to code the analogue signal before the shift register causing the delay followed by decoding in each point of the delay register when the delayed signal is to be obtained. Such filters using delta coding of the signal have been described for example in French Patent No. 1,520,800 but it may be noted that in this filter described in this Patent likewise is in the filters of the same type described by G. B. Lockhart in an article entitled "Digital Encoding and Filtering using Delta Modulation" published in "the Radio Electronic Engineer" Volume 42, Nr. 12, December 1972 the delta coder used for quantizing the analogue signals is necessarily a delta coder having constant stages.

The invention has for its object to improve the filters of this kind using delta signal coding.

According to the invention a digital filter is characterized in that said feedback circuit associated with the delta modulator and each of the level control devices as well as said output circuit are provided with a dynamic expander which as a function of the pulses supplied by the delta modulator supplies an output signal of adjustable magnitude.

The use of a coder using numerical compression such as the one described in French Patent No. 2,004,446 permits of coding the analogue signals in a large dynamic range maintaining a quasiconstant signal to quantizing noise ratio. A delta coder having constant stages thus without compression does not permit of coding correctly a small signal dynamic range. This would be a considerable drawback for realizing recursive filters in which a weighing of the signal shifted in time is superimposed on the digital filter are proportional to F which is also the shift frequency of the shift register it can be easily found for example in the case of a recursive digital filter having two stages and providing a single tuning frequency by causing F to vary between $F_1$ and $F_2$ and by changing the tuning frequency of the filter between $f_1$ and $f_2$ in such a manner that $f_1/F_1 = f_2/F_2$ and that the output signals on the filters are quasi sinusoidal particularly when the filter is very narrow whose signal to noise ratios are the same and are independent of the level of the input signal.

On the other hand when using a delta coder with a constant step the previous result would not be achieved except when the value of the step and the clock frequency would be changed at the same time; in any case the signal to noise ratio of the output signals of such a filter would be quite dependent on the level of the input signals.

It is to be noted that the use of a delta compression coder in the digital filter permits it very easily to introduce in the response of the filter interesting non-linear phenomena simply by decoding the delayed delta signal in the different stages of the register by expansion decoders having an expansion characteristic which is different from the local delta decoder used in the compression delta coder.

When for example realizing a non-recursive filter in which the delta decoder other than the local decoder are decoders with a constant step the equivalent of a linear filter is obtained preceded with a circuit of the dynamic compression which is substantially perfect. When the input signal of the filter increases the step of the delta coder increases maintaining a quasi constant ratio between the level of the signal and the step of the coder. On the other hand the weighing of the delta signals delayed by the shift register is a weighing of signals having a quasi constant amplitude because they are decoded with a constant delta step. Such filters may be very interesting for example for modems using delta transmission in which the absolute amplitude of the received signals is not important but particularly for the distribution of the energy in input signal to be coded particularly when the filter is a very selective frequency filter this weighing of signals shifted in time has a higher level than the signal to be filtered when this has frequencies in the vicinity of the resonant frequency of the filter. Thus it is obvious that in the recursive filters using delta coding with a constant stage it is difficult to regulate the value of the coding step for optimum coding because the frequency contents of the signal to be filtered should be known in advance.

In the same manner the use of a delta compression coder in digital filter permits of realizing very simply the variation of the tuning frequencies of the filter by modifying the frequency F of a clockpulse generator controlling sampling of the compression delta modulator and the shift of the shift register. It is known that in a compressing coder the signal to quantizing noise ratio is independent of the level of the signal and depends on the ratio of $F/f$ where F is the sampling frequency of the delta coder and $f$ is the frequency of the signal to be coded, the tuning frequency is of the energy in the different frequency bands.

Three embodiments of the invention relate to very simple structures of the filter according to the invention resulting from the use of delta decoders of the current generator type.

The invention will now be described with reference to the accompanying drawings.

Figure 1:
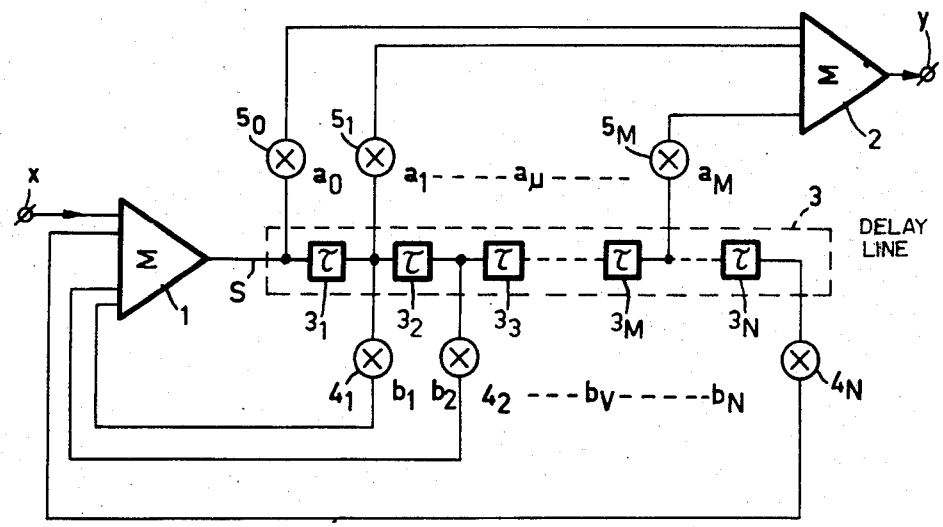
FIG. 1 shows the known structure of a digital filter.

FIG. 1 shows the known analogue transversal filter. The delay line 3 carries a certain number of elementary cells $3_1 \ldots 3_N$ each having a delay of $\tau$. The signals provided by each of these cells are added in two adder amplifiers 2 and 1 after weighing by coefficients $a_0, a_1 \ldots a_M$ and $b_1, b_2 \ldots b_N$, i.e. multiplication by the multipliers $5_0$ to $5_M$ and $4_1$ to $4_N$. The output terminal of the adder amplifier 2 is the output terminal of the filter and the analogue signal to be filtered is applied to one input of the adder 1. It is to be noted that FIG. 1 shows the case where N > M but those skilled in the art will understand that it is alternatively possible for M ≥ N. When the coefficients $a_0, a_1 \ldots a_M$ and $b_1, b_2 \ldots b_N$ may be negative or even zero for several of them according to the characteristics of the filter to be realized.

Figure 2:
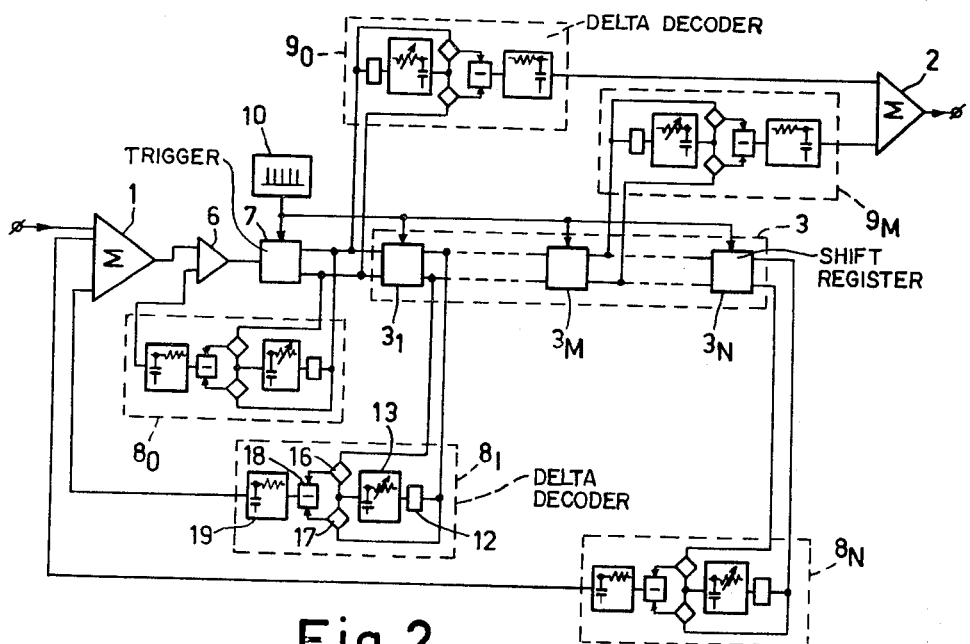
FIG. 2 shows the structure of a digital filter according to the invention using expansion delta decoders an embodiment of which is shown in FIG. 3.

FIG. 2 shows by way of comparison the filter according to the invention. The same elements in FIGS. 1 and 2 have the same reference numerals. The filter has a shift register 3 having N cells $3_1$ to $3_N$ with P stages of which the contents may be shifted at the frequency of $F = p/\tau$ of the pulses supplied by a clock 10. Binary information remains for $\tau$ seconds in each of the N cells of the register. Each output of the stages of the register is connected to the expansion delta decoders $8_1$ to $8_N$ and $9_0$ to $9_M$. These expansion delta decoders correspond to those described in French Pat. No. 2,004,446 and FIG. 3 shows the principal circuit diagram.

The outputs of the expansion delta decoders $8_1$ to $8_N$ and $9_0$ to $9_M$ are connected to input terminals of the adder amplifiers 1 and 2 when the output of the amplifier 2 constitutes the output terminal of the filter and an input of the amplifier 1 constitutes the input terminal of the filter.

The comparator, 6, the trigger 7 controlled by the clock 10, and the local expansion decoder $8_0$ constitute a delta compression coder such as the one described for example in French Patent No. 2,004,446.

Figure 3:
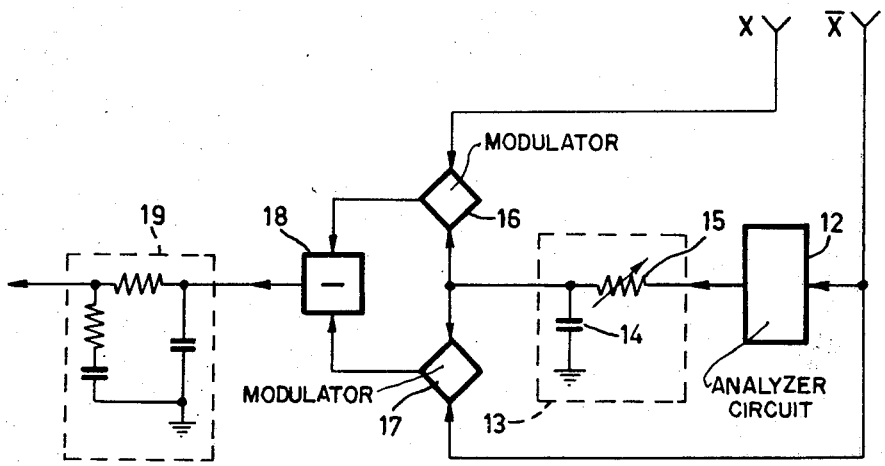

FIG. 3 shows by way of example a local expansion decoder according to this Patent. The circuit 12 is an analyser circuit of pulse trains which are delta coded and provide the compression pulses.

When the binary delta rhythm at the input X (or its inverse input $\overline{X}$) carries 4 pulses of the same sign the circuit 12 provides a pulse which is limited in duration and amplitude which is integrated in the integration network 13 constituted by the capacitor 14 and the resistor 15.

The slow variable voltage available at the output of the integrator 13 is modulated by the modulators 16 and 17, that is to say, directed in accordance with polarity of the binary signal X by one of the circuits 16 or 17 to the difference producer 18 which is preferably a current injector. When for example X = 1 a current proportional to the voltage available at the output of the integrator 13 originates from the injector 18 and is past on to the integrator network 19; if on the other hand X = 0 a current of the same value is returned to the injector 18. The variable resistor 15 very simply permits of adjusting the current provided by the injector 18 for the same binary delta signal X. All decoders in FIG. 2 are identical to those in FIG. 3 and have the same elements. The elements of the decoder $8_1$ have the same reference numerals as in FIG. 3. It will be evident that after the previous description that the expansion delta decoders $8_1$ to $8_N$ and $9_0$ to $9_M$ not only operate as delta decoders but also as the multipliers $4_1$ to $4_N$ and $5_0$ to $5_M$ of FIG. 1. The tandem connection of the compression delta coder (formed by the local decoder $8_0$, comparator 6 and trigger 7 controlled by the clock 10) the shift register 3 and the delta decoders function in a manner comparable to that of a delay line constituted by N elementary cells having an elementary delay which is equal to $p$ clock times. The multipliers $4_1$ to $4_N$ and $5_0$ to $5_M$ of FIG. 1 are replaced by variable resistors for each of the expansion delta decoders $8_1$ to $8_N$ and $9_0$ to $9_M$.

On the other hand it is very easy to realize equivalent negative coefficients $b_1$ to $b_N$ and $a_0$ to $a_M$. In that case it is sufficient in FIG. 3 to switch the connections X and $\overline{X}$ of the delta decoders.

On the other hand it can be seen that when the clock frequency 10 is varied everything is effected as if a transversal analogue filter were used of which the elementary delay would be changed by each cell of the delay line.

FIG. 2 shows that the delta decoders $8_1$ to $8_N$ and $9_0$ to $9_M$ all have their output integrator network 19 each being fed by a current injector 18. These integrator networks are identical and it is therefore possible to replace them by a single one for $8_1$ to $8_N$ and a single one for $9_0$ to $9_M$.

Figure 4:
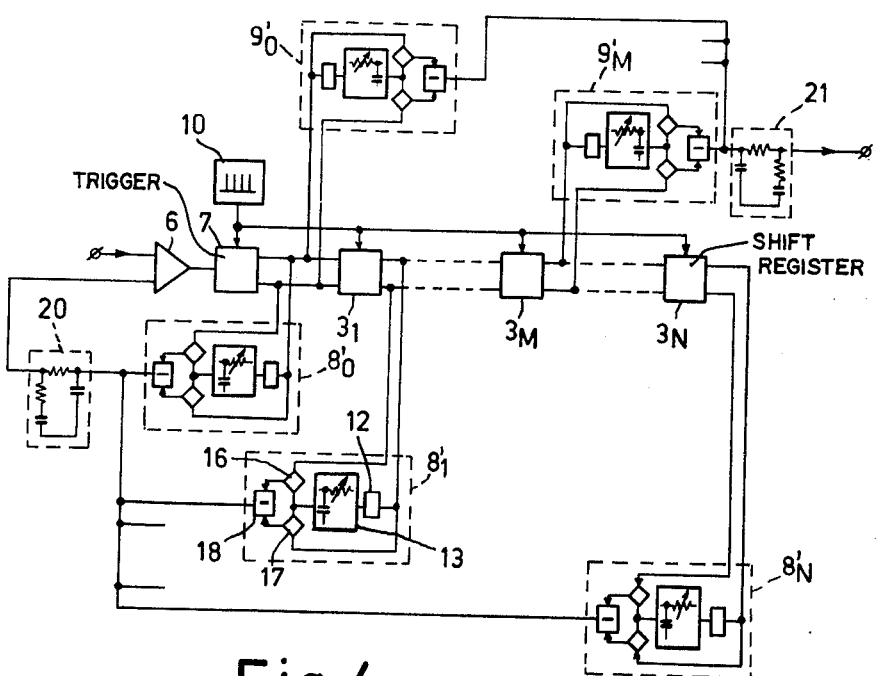
FIG. 4 shows a simple modification of the filter according to the invention.

This is shown in FIG. 4 in which the elements already described with reference to FIG. 2 have the same reference numerals. The adder amplifiers 1 and 2 of FIG. 2 have been omitted while the addition is directly effected at the level of the current injected by the circuits $8_1'$ to $8_N'$ and $9_0'$ to $9_M'$ of FIG. 4 which are circuits whose integrator networks have been omitted and each comprise a cascade, a pulse train analyser 12, the integrator 13, the amplitude modulators 16 and 17 and the current injector 18.

The addition of the currents is directly effected on the integrator network 20 and the integrator network 21. It is even possible to apply the same for the local decoder $8_0$ of FIG. 2. The integrator network of this local decoder $8_0$ may be omitted and the output may be connected in the current injector of the circuit $8_0'$ directly to the input terminal of the integrator network 20.

In addition to a considerable economy the arrangement of FIG. 4 ensures great precision of the filters thus realized. In the circuit diagram of FIG. 2 an inequal drift of the integrator networks 19 of the decoders $8_1$ to $8_N$ and $9_0$ to $9_M$ may cause the transverse function of the filter to vary. In the arrangement of FIG. 4 a drift of the integrator networks 20 and 21 effects all the coefficients in the same manner which only result in a possible variation of the constant level in all frequency bands.

Delta decoders $8_1$ to $8_N$ and $9_0$ to $9_M$ of FIG. 2 may not have an expansion characteristic which is identical to that of the local delta decoder $8_0$.

Figure 5:
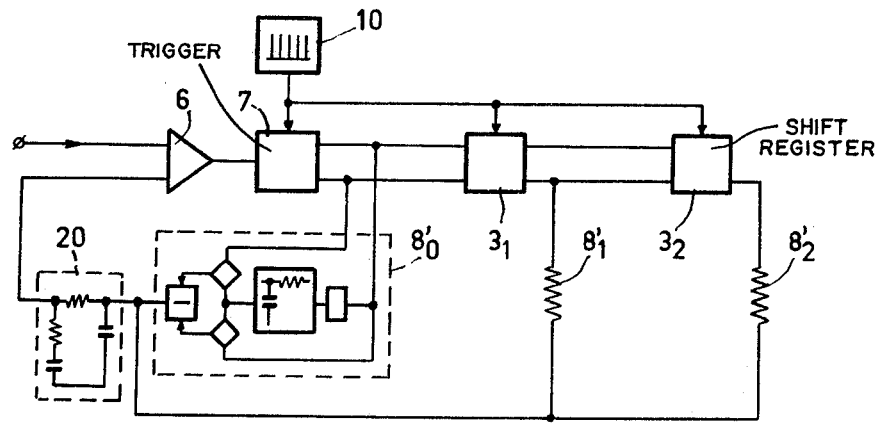
FIG. 5 shows a filter according to the invention with a recursive structure and a negative damping coefficient of the tuning frequency.

FIG. 5 shows by way of example a second order recursive filter according to the invention using this property. The coefficients of this filter are chosen in manner such that the filter is unstable, that is to say it operates as an oscillator.

FIG. 5 shows a special case in which decoders $9_0'$ to $9_M'$ are omitted and in which the decoders $8_1'$ to $8_N'$ do not have the same expansion characteristic as the decoder $8_0'$. The shift register comprises two stages $3_1$ and $3_2$. The decoders $8_1'$ and $8_2'$ are decoders with a constant step and for the sake of simplicity they are represented by two resistors adding or subtracting a current in accordance with the binary delta signal in the integrator network 20.

When the decoders $8_1'$ and $8_2'$ were expansion decoders identical to the local decoder $8_0'$ the filter would be linear and unstable which means that an oscillation having an uncontrollable amplitude would be produced. The fact that $8_1'$ and $8_2'$ are decoders with a constant step the control element would be formed for example when the coded delta signal obtained at the output of the trigger 7 corresponds to a weak signal, that is to say if the step given by the local decoder $8_0'$ is weak and the decoders $8_1'$ and $8_2'$ with a constant step cause signals which are stronger coded than those given by the expansion decoders. This results in the signal coded by the delta coder increasing. Conversely if the signal coded by the delta coder is very strong the decoders with a constant step $8_1'$ and $8_2'$ would produce very weak signals just as those given by the expansion decoders and the delta coded signal would have the tendency to decrease.

An oscillation having a stable amplitude is established. It can be shown more precisely that the amplitude of the oscillation is such that the delta step provided by the local decoder $8_0'$ is equal to the constant step provided by the decoder constituted by the resistor $8_2'$. On the other hand the step given by the decoder $8_1'$ may be rendered equal to zero which would mean that the resistor $8_1'$ is omitted. In this case it can be shown that the frequency of the oscillation is $f_0 = F/4p$ where F is the clockpulse frequency and $p$ is the number of binary steps for each delay cell such as $3_1$ and $3_2$.

The filter according to the invention may be simplified by using the same pulse train analyser circuit 12 for all expansion decoders which circuit provides compression pulses. This simplification is possible when the analogue signal to be filtered comprises frequency components which are very high as compared with the frequency of the compression signal.

Figure 6:
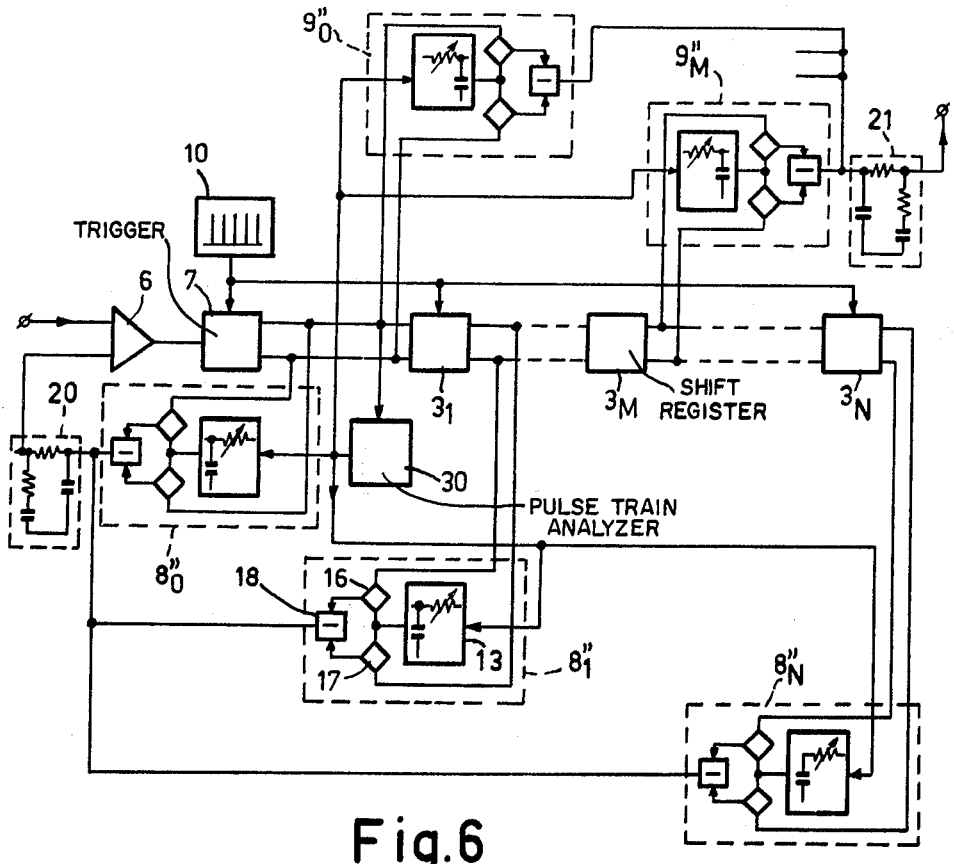
FIG. 6 shows a further modification of the filter according to the invention.

FIG. 6 shows this simplification used for the filter of FIG. 4 and the corresponding elements in these two Figures have the same reference numerals. The pulse train analyser 30 connected to the input of the trigger 7 of the coder provides the same compression pulses for the circuits $8_0''$ to $8_N''$ and $9_0''$ to $9_M''$ which each comprise in cascade the integrator circuit 13, the amplitude modulators 16 and 17 and the current injector circuit 18. The outputs of these circuits $8_0''$ to $8_N''$ are connected to the integrator 20 and the outputs of the circuits $9_0''$ to $9_M''$ are connected to the integrator 21.

It is alternatively possible to simplify the filter according to the invention by using time division techniques concerning the operation of the circuits $8_0''$ to $8_N''$ and $9_0''$ to $9_M''$ of FIG. 6. Instead of having as in FIG. 6 N + 1 circuits $8_0''$ to $8_N''$ each continuously injecting during the duration $\tau' = \tau/P$ of a clockpulse time a positive or negative current proportional to the comparison signal provided by the circuit 30 whose amplitude is separately controlled by each circuit $8_0''$ to $8_N''$ according to the weighting coefficients of the filter to be realized it is possible to have only the circuit $8_0''$ by connecting it cyclically during the clock time $\tau'$ by means of logical conventional means to different connections of the shift register constituted by N stages $3_1$ to $3_N$. The weighting coefficients of the filter to be realized are obtained in this case by connecting during a more or less long time the circuit $8_0''$ to each of the register stages.

More particularly the clock period $\tau'$ may be divided in N + 1 parts $\tau_0, \tau_1, \ldots \tau_N$, $$\text{(where } \tau' = \sum_0^N \tau_i\text{)}$$

so that the ratios $\tau_0/\tau_0, \tau_1/\tau_0, \tau_2/\tau_0, \ldots \tau_N/\tau_0$ are equal to the absolute values of the weighting coefficients of the filter $b_0 (= 1), b_1, b_2 \ldots b_N$.

In the same manner the circuits $9_0''$ to $9_M''$ may be replaced by the circuit $9_0''$ cyclically connected to the logical outputs of the stages $3_1$ to $3_M$ during the times $\tau'_0, \tau'_1, \ldots \tau'_M$ $$\text{(where } \tau' = \sum_0^M \tau'_i\text{)}$$

proportionally to the weighting coefficients $a_0, a_1, \ldots a_M$ of filter to be realized.

Figure 7:
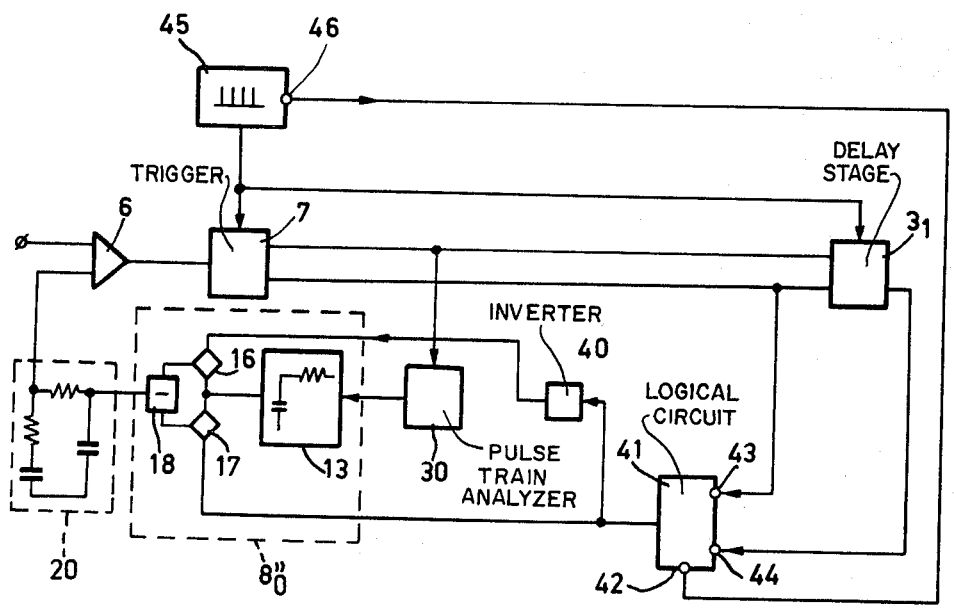
FIG. 7 shows a further simple modification of the filter according to the invention.

FIG. 7 shows by way of example a very simple and attractive embodiment of a filter using a single delay stage (N = 1) corresponding to the one described hereinbefore.

The two logical inputs of the current injector circuit $8_0''$ are connected on the one hand directly and on the other hand to a logical inverter 40 to the output of the logical circuit 41 having 3 inputs. The operation of the conventional circuit 41 is as follows. When for example the logical signal at one of the inputs 42, referred to as command input of the circuit 41 is an 1, a logical signal which is present at one input 43 of the two other inputs of the circuit 41; conversely if the logical signal present at the command input 42 is a 0, the logical signal at the output of 41 is the same as is present at the other input 44 of the circuit 41.

The clock 10 of FIG. 6 is replaced by a clock 45 providing in addition to the pulse having a period of $\tau' = \tau/p$ provided by the clock 10 a logical signal recurring with a period of $\tau'$ and with a cyclic ratio of $\delta/\tau'$. The object of the present invention is not to describe means which are well-known to those skilled in the art of realizing the circuit 45. The output of the circuit 45 which provided the logical signal with the cyclic ratio of $\delta/\tau'$ is connected to the command terminal 42 of the circuit 41.

During the time $\delta$ of the period $\tau'$ the circuit $8_0''$ is connected through its logical inputs to the output of the circuit 7 and during the time $\tau' - \delta$ of the period $\tau'$ it is connected to the logical output of the delay stage $3_1$.

Thus a recursive digital filter is realized for which the coefficient $$(-b_1) = \frac{\tau' - \delta}{\delta}.$$

The transfer function of such a filter is known and is equal to $$H(\omega) = \frac{1}{1 + \frac{\tau' - \delta}{\delta} e^{j\omega\tau}}$$

where $\tau = p\,\tau'$, where $p$ is the number of binary steps of the delay element $3_1$.

The module of the transfer function may be written as:

$$|H(\omega)| = \frac{1}{(1 - \frac{\tau' - \delta}{\delta})^2 + 4\frac{\tau' - \delta}{\delta}\cos^2 \omega\tau}$$

In the vicinity of the frequency $\omega_0$ where $\omega_0\tau = \pi/2$ the filter behaves as a tuned circuit having an overvoltage coefficient.

$$\frac{\pi}{2} \cdot \frac{\delta}{2\delta - \tau'}$$

and it can be seen that the cyclic ratio $\delta/\tau'$ is very near to ½ the overvoltage of the filter may be very high.

The preceding embodiment illustrates one of the essential advantages of this invention. Inevitable imperfections of the current injector circuit $8_0''$ the characteristics of filtering the filter according to the invention are in this modification of the invention only connected with the stability of the signals of the logical type provided by the clock 45 with the stability that can be very easily obtained.

For the purpose of simplification FIG. 7 shows a filter according to the invention without a recursive section. The output signal of such a filter may be the binary delta signal obtained at the output of the coder 7. A filter thus used according to the circuit diagram of FIG. 7 effects an operation which is equivalent to that of analogue filtering followed by delta coding which is almost as cheap as that of a simple delta coding which would necessitate all the elements of FIG. 7 except for the shift register $3_1$ and the very simple logical circuits 40 and 41.

What is claimed is:

1. A digital filter comprising
   clock pulse generator means for generating clock pulses;
   input means for receiving an input signal to be processed;
   delta modulator means responsive to said clock pulses for modulating the output of said input means, and having an output;
   delay means connected to the output of said delta modulator means, comprising a plurality of stages, at least some of said stages having a tap;
   and decoder means connected to said taps for supplying an output signal of predetermined magnitude, and a feedback signal to said input means.

2. A digital filter as defined in claim 1, wherein said input means includes combination means for combining said input signal and said feedback signal to produce a combined signal; and
   wherein said delta modulator means comprise comparator means for comparing said combined signal to a local expansion signal to produce a resulting signal.

3. A digital filter as defined in claim 2, wherein said decoder means comprises:
   a first feedback circuit comprising a plurality of expanders having predetermined expansion characteristics connected between said taps and said input means; and
   wherein said delta modulator means includes a feedback circuit for producing said local expansion signal.

4. A digital filter as defined in claim 3, wherein said second feedback circuit comprises an expander having an expansion characteristic which is different from at least one of said predetermined expansion characteristics.

5. A digital filter comprising
   an input line for receiving an input signal to be processed;
   delay means, having an input, and comprising a plurality of stages, at least some of said stages having a tap;
   decoder means connected to said taps for supplying an output signal of predetermined magnitude, and a feedback signal;
   input means for combining said input signal and said feedback signal to produce a combined signal; and
   comparator means for comparing said combined signal to a local expansion signal to produce a resulting signal applied to the input of said delay means.

6. A digital filter comprising
   input means for receiving an input signal to be processed;
   a shift register connected to said input means, said shift register having a plurality of stages, at least some of said stages having a tap;
   a feedback circuit connected to said taps and comprising expander means including an integrator having an adjustable time constant.

7. A digital filter as defined in claim 6, wherein said expander means further comprises a pulse group analyzer for analyzing pulses applied to said feedback circuit.

8. A digital filter as defined in claim 7, wherein said pulse group analyzer has an input connected to one of said taps and an output connected to said integrator.

* * * * *

UNITED STATES PATENT AND TRADEMARK OFFICE
CERTIFICATE OF CORRECTION

PATENT NO. : 3,968,354
DATED : July 6, 1976
INVENTOR(S) : GILBERT MARIE MARCEL FERRIEU It is certified that error appears in the above-identified patent and that said Letters Patent are hereby corrected as shown below:

On the title page, section [73] should read as follows:
--[73] Assignee: T.R.T. Telecommunications Radioelectriques et Telephoniques, Paris, France--

Column 1, line 15, "said" should be --the--

Column 6, line 51, "of the period $\gamma'$" should be --of the period $\tau'$--

Signed and Sealed this

Tenth Day of May 1977

[SEAL]

Attest:

RUTH C. MASON
Attesting Officer

C. MARSHALL DANN
Commissioner of Patents and Trademarks